United States Patent
Hirose et al.

(10) Patent No.: US 10,113,235 B2
(45) Date of Patent: Oct. 30, 2018

(54) SOURCE GAS SUPPLY UNIT, FILM FORMING APPARATUS AND SOURCE GAS SUPPLY METHOD

(71) Applicant: Tokyo Electron Limited, Tokyo (JP)

(72) Inventors: Masayuki Hirose, Yamanashi (JP); Shigeyuki Okura, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 329 days.

(21) Appl. No.: 14/228,166

(22) Filed: Mar. 27, 2014

(65) Prior Publication Data

US 2014/0290575 A1    Oct. 2, 2014

(30) Foreign Application Priority Data

Mar. 29, 2013  (JP) ................................. 2013-073018

(51) Int. Cl.
| | |
|---|---|
| *C23C 16/52* | (2006.01) |
| *C23C 16/448* | (2006.01) |
| *C23C 16/18* | (2006.01) |
| *C23C 16/44* | (2006.01) |

(52) U.S. Cl.
CPC .............. *C23C 16/52* (2013.01); *C23C 16/18* (2013.01); *C23C 16/4412* (2013.01);
(Continued)

(58) Field of Classification Search
CPC . C23C 16/18; C23C 16/4412; C23C 16/4481; C23C 16/52; Y10T 137/0318;
(Continued)

(56) References Cited

U.S. PATENT DOCUMENTS 4,341,107 A * 7/1982 Blair ...................... C23C 16/52
                                                                137/101.19
5,575,854 A * 11/1996 Jinnouchi ........... C23C 16/4482
                                                                118/715
(Continued)

FOREIGN PATENT DOCUMENTS

| DE | 102011051931 A1 * | 1/2013 | ......... C23C 16/4486 |
| JP | H10-144683 A | 5/1998 | |

(Continued)

OTHER PUBLICATIONS

Masamichi Hara; Thin Film Forming Apparatus and Thin Film Forming Method; Abstract of JP Publication No. 2006-052424; Feb. 23, 2006; http://www19.ipdl.inpit.go.jp/.

*Primary Examiner* — Dah-Wei D. Yuan
*Assistant Examiner* — Jose Hernandez-Diaz

(57) ABSTRACT

A source gas supply unit includes a carrier gas supply unit for supplying a carrier gas into a raw material tank, and a control unit. The control unit executes steps of: supplying the carrier gas to the raw material tank while varying a flow rate of the carrier gas without forming a film on a substrate, and storing a vaporization flow rate table showing the correspondence between a vaporization flow rate of the vaporized raw material contained in a source gas and a carrier gas flow rate set value; obtaining a carrier gas flow rate set value corresponding to a specified vaporization flow rate set value by using the vaporization flow rate table; and generating the source gas by supplying the carrier gas into the raw material tank based on the obtained carrier gas flow rate set value and supplying the generated source gas to a film forming unit.

3 Claims, 4 Drawing Sheets

(52) U.S. Cl.
CPC ..... *C23C 16/4481* (2013.01); *Y10T 137/0318* (2015.04); *Y10T 137/8158* (2015.04)

(58) Field of Classification Search
CPC ............. Y10T 137/8158; G01F 15/002; G01F 15/0007
USPC .................... 427/8, 10; 118/696; 137/1, 551
See application file for complete search history.

(56) References Cited

U.S. PATENT DOCUMENTS

| | | | |
|---|---|---|---|
| 2004/0007180 A1* | 1/2004 | Yamasaki | C23C 16/16 118/715 |
| 2005/0095859 A1* | 5/2005 | Chen | C23C 16/4481 438/689 |
| 2006/0032444 A1 | 2/2006 | Hara | |
| 2006/0115589 A1* | 6/2006 | Vukovic | C23C 16/16 427/248.1 |
| 2008/0141937 A1* | 6/2008 | Clark | C23C 16/4481 118/697 |
| 2009/0061643 A1 | 3/2009 | Takeyama et al. | |
| 2010/0062158 A1* | 3/2010 | Hara | C23C 16/52 427/255.28 |

FOREIGN PATENT DOCUMENTS

| | | |
|---|---|---|
| JP | H11-026399 A | 1/1999 |
| JP | 2001-518560 A | 10/2001 |
| JP | 2006-52424 | 2/2006 |
| WO | 99/16930 A1 | 4/1999 |
| WO | 2006/100862 A1 | 9/2006 |

\* cited by examiner

*FIG.2*

| CARRIER GAS FLOW RATE SET VALUE (sccm) | VAPORIZATION FLOW RATE (sccm) |
|---|---|
| 50 | 5 |
| 62.5 | 9.75 |
| 75 | 14.5 |
| 87.5 | 19.25 |
| 100 | 24 |
| ⋮ | ⋮ |
| 300 | 100 |

51

SOURCE GAS SUPPLY UNIT, FILM FORMING APPARATUS AND SOURCE GAS SUPPLY METHOD

CROSS-REFERENCE TO RELATED APPLICATION

This application claims priority to Japanese Patent Application No. 2013-073018 filed on Mar. 29, 2013, the entire contents of which are incorporated herein by reference.

FIELD OF THE INVENTION

The present invention relates to a technique for vaporizing a raw material in a carrier gas and controlling a flow rate of raw material, which is vaporized in a carrier gas, in a source gas supplied to a film forming unit in a carrier gas.

BACKGROUND OF THE INVENTION

A method for forming a film on a substrate such as a semiconductor wafer or the like (hereinafter, referred to as "wafer") includes a CVD (Chemical Vapor Deposition) method for forming a film by supplying a source gas to a surface of a wafer and reacting the source gas by, e.g., heating the wafer, an ALD (Atomic Layer Deposition) method for allowing an atom layer or a molecular layer of a source gas to be adsorbed on a surface of a wafer, generating a reaction product by supplying a reactant gas that oxidizes and reduces the source gas, and depositing a layer of the reaction product by repeating such processes, and the like. These processes are performed by supplying a source gas into a reaction chamber (processing chamber) in which a wafer is accommodated and a vacuum atmosphere is present.

Most raw materials used in the CVD, the ALD or the like often have low vapor pressures. In that case, the source gas is obtained by supplying a carrier gas to the raw material tank accommodating a liquid or solid raw material and vaporizing the raw material in the carrier gas. Meanwhile, in order to control a thickness or a film quality of a film formed on a wafer, the amount of the raw material contained in the source gas needs to be accurately controlled.

For example, Japanese Patent Application Publication No. 2006-52424 (paragraph 0067 and FIG. 15) discloses a technique for monitoring a flow rate of a vaporized raw material by deducting a flow rate set value of a carrier gas from a measured flow rate of a source gas that is a gaseous mixture of the vaporized raw material and the carrier gas in case the source gas generated by supplying the carrier gas to a raw material tank.

However, in the above-described method, even if the flow rate of the carrier gas is controlled at a constant level, the flow rate of the vaporized raw material may change due to the decrease in the amount of the raw material in the raw material tank and the changes in residence time of the carrier gas, for example. In this regard, Japanese Patent Application Publication No. 2006-52424 does not disclose how to control a flow rate set value of the carrier gas for obtaining a source gas containing a desired amount of the raw material. Accordingly, even if the flow rate of the vaporized raw material is monitored, the flow rate set value of the carrier gas is adjusted by trial and error, and a long period of time is required until the accurate flow rate of the vaporized raw material is obtained.

SUMMARY OF THE INVENTION

In view of the above, the present invention provides a source gas supply unit, a film forming apparatus and a source gas supply method, capable of accurately controlling a flow rate of a vaporized raw material contained in a source gas by a simple method.

In accordance with an aspect of the present invention, there is provided a source gas supply unit for supplying a source gas to a film forming unit for forming a film on a substrate, including: a raw material tank accommodating a solid or liquid raw material; a carrier gas supply unit having a carrier gas flow rate control unit for controlling a flow rate of a carrier gas based on a carrier gas flow rate set value, the carrier gas supply unit serving to supply the carrier gas into the raw material tank; a flow rate measuring unit configured to output a measured flow rate of the source gas containing the raw material that has been vaporized and discharged from the raw material tank; a source gas supply line through which the source gas from the raw material tank is supplied to the film forming unit; a control unit configured to output a control signal to execute a step of supplying the carrier gas to the raw material tank while varying the flow rate of the carrier gas without forming a film on a substrate, obtaining a vaporization flow rate of the vaporized raw material contained in the source gas based on a difference between the flow rate measured by the flow rate measuring unit and the carrier gas flow rate set value, and storing in a storage unit a vaporization flow rate table showing the correspondence between the vaporization flow rate and the carrier gas flow rate set value; a step of obtaining the carrier gas flow rate set value corresponding to a specified vaporization flow rate set value by using the vaporization flow rate table; and a step of generating the source gas by supplying the carrier gas into the raw material tank based on the obtained carrier gas flow rate set value and supplying the generated source gas to the film forming unit.

BRIEF DESCRIPTION OF THE DRAWINGS

The objects and features of the present invention will become apparent from the following description of embodiments, given in conjunction with the accompanying drawings, in which:

FIG. 2 explains a vaporization flow rate table stored in the source gas supply unit;

DETAILED DESCRIPTION OF THE EMBODIMENTS

Figure 1:
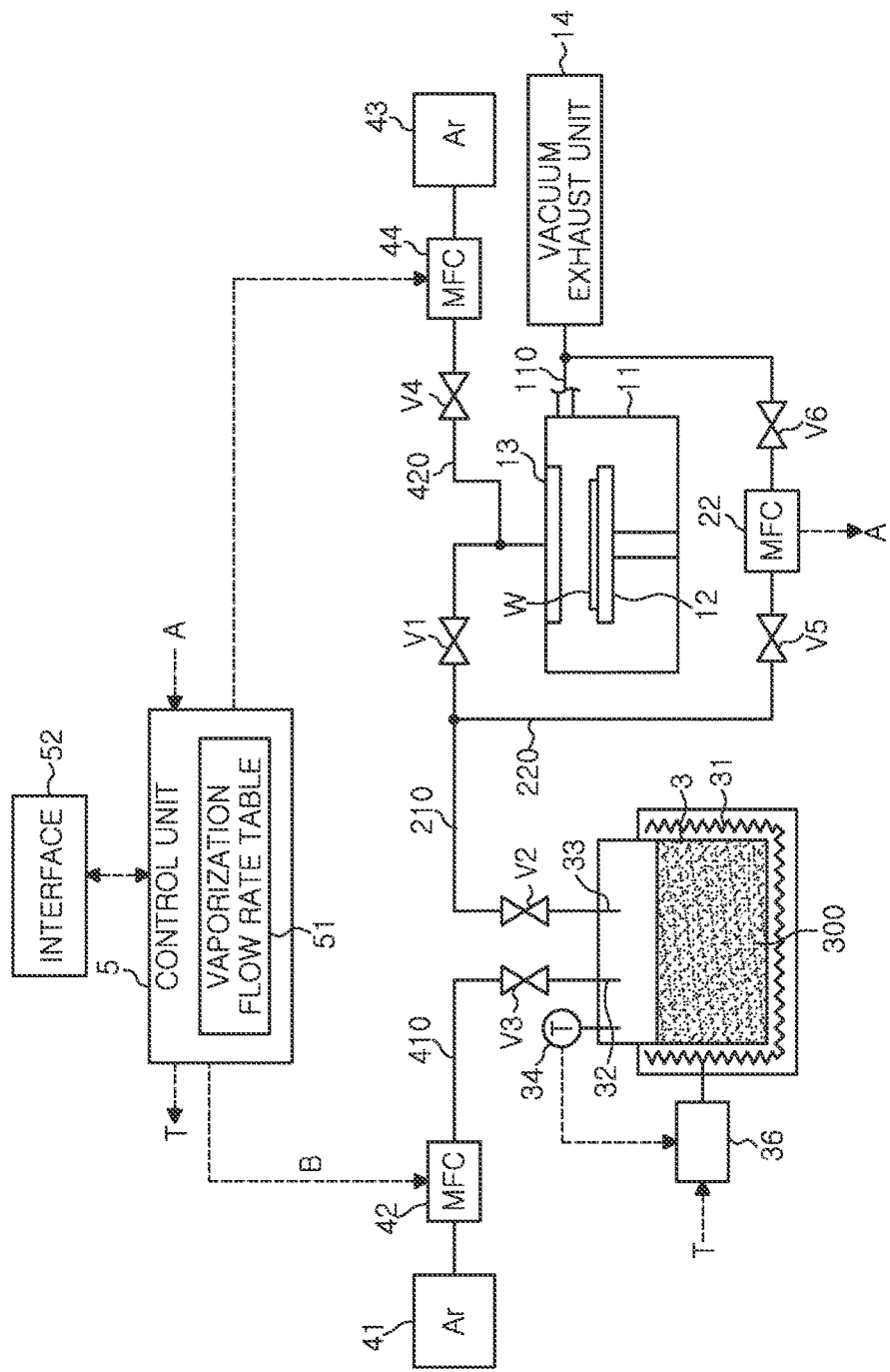
FIG. 1 is an entire configuration diagram of a film forming apparatus including a source gas supply unit in accordance with an embodiment of the present invention.

Hereinafter, a configuration example of a film forming apparatus including a source gas supply unit in accordance with an embodiment of the present invention will be described with reference to FIG. 1. The film forming apparatus includes a film forming unit for forming a film on a wafer W as a substrate by using a CVD method, and a source gas supply unit for supplying a source gas to the film forming unit.

The film forming unit is configured as a main body of a single sheet processing type film forming apparatus. The film forming unit includes: a mounting table 12 having a heater (not shown), for horizontally supporting the wafer W in a processing chamber 11 as a vacuum container; and a gas inlet 13 for introducing a source gas or the like into the processing chamber 11. The processing chamber 11 is exhausted to vacuum, and a film is formed on a surface of the heated wafer W by introducing the source gas into the processing chamber 11 from the source gas supply unit.

For example, in case of forming a Ni (nickel) film by the CVD method, the film forming process is performed by reducing a Ni organic metal compound such as Ni(II)N or N'-di-tertiary-butylamidinate (Ni(II)(tBu-AMD)$_2$) (hereinafter, referred to as "Ni(AMD)$_2$") using a reduction gas such as ammonia gas or the like to deposite a Ni film on the surface of the wafer W. FIG. 1 shows a configuration example of the source gas supply unit for heating and vaporizing solid Ni(AMD)$_2$ at a room temperature and supplying the vaporized Ni(AMD)$_2$ with the carrier gas to the film forming unit.

The source gas supply unit of the present example includes a raw material tank 3 accommodating Ni(AMD)$_2$ as a raw material, and a carrier gas supply source 41 for supplying a carrier gas into the raw material tank 3.

The raw material tank 3 is a tank accommodating a liquid raw material 300 liquefied by heating solid Ni(AMD)$_2$, and is covered by a jacket-shaped heating unit 31 having a resistance heating element. The temperature in the raw material tank 3 can be controlled by increasing/decreasing the amount of power supplied from the power supply unit 36 based on the temperature of a vapor phase part in the raw material tank 3 detected by a temperature detecting unit 34. The temperature of the heating unit 31 is set to a range in which the liquid raw material 300 is liquefied and Ni(AMD)$_2$ is not decomposed, e.g., to 150° C.

Inserted into the vapor phase part above the liquid raw material 300 in the raw material tank 3 are a carrier gas nozzle 32 for introducing a carrier gas into the raw material tank 3 through a carrier gas channel 410, and an extract nozzle 33 for extracting the source gas from the raw material tank 3 to the source gas supply line 210.

The carrier gas nozzle 32 is connected to the carrier gas channel 410 having an opening/closing valve V3 and a MFC (mass flow controller) 42 thereon, and a carrier gas supply source 41 is provided at an upstream side of the carrier gas channel 410. As for the carrier gas, an inert gas, e.g., Ar (argon) gas or the like, is used. The carrier gas supply source 41, the MFC 42, and the carrier gas channel 410 constitute a carrier gas supply unit of the present example. The MFC 42 serves as a carrier gas flow rate control unit.

Meanwhile, the extract nozzle 33 is connected to a source gas supply line 210 having an opening/closing valve V2 thereon. The source gas extracted from the raw material tank 3 is supplied to the film forming unit through the source gas supply line 210. The processing chamber 11 is exhausted to vacuum by a vacuum exhaust unit 14 having a vacuum pump or the like through a gas exhaust line 110 and maintained at a vacuum atmosphere.

The source gas supply line 210 branches off, at an upstream side of the processing chamber 11 to a bypass line 220 connected to the vacuum exhaust unit 14 without passing through the processing chamber 11. A MFM (mass flow meter) 22 is provided on the bypass line 220 to measure the flow rate of the source gas (containing the vaporized raw material and the carrier gas) discharged from the raw material tank 3. The MFM 22 corresponds to the flow rate measuring unit of the present example.

A large pressure loss may occur in the MFM 22. For this reason, the MFM 22 is provided at the bypass line 220 different from the source gas supply line 210 to suppress the decrease in the flow rate of the source gas supplied to the film forming unit during the film formation.

The switching between the source gas supply line 210 and the bypass line 220 is performed by opening/closing an opening/closing valve V1 provided on the line 210 and opening/closing valves V5 and V6 provided on the channel 220. In this regard, the opening/closing valves V1, V5 and V6 serve as a switching unit for switching the destination of the source gas from the source gas supply line 210 between the film forming unit (the processing chamber 11) and the bypass line 220.

Further, a dilution gas channel 420 for supplying a dilution gas to be mixed with the source gas to the connection portion with the gas inlet 13 in the processing chamber 11 joins with the source gas supply line 210. An opening/closing valve V4 and a MFC 44 are provided on the dilution gas channel 420, and a dilution gas supply source 43 for supplying Ar gas (inert gas) as a dilution gas is provided at an upstream side thereof. The dilution gas supply source 43, the MFC 44, and the dilution gas channel 420 constitute a dilution gas supply unit of the present example, and the MFC 44 serves as a dilution gas flow rate control unit.

The film forming apparatus (the film forming unit and the source gas supply unit) configured as described above is connected to the control unit 5. The control unit 5 includes a computer having, e.g., a CPU and a storage unit (not shown). The storage unit stores a program having a group of steps (commands) for controlling the operation of the film forming apparatus, i.e., the steps of mounting the wafer W on the mounting table 12, exhausting the processing chamber 11 to vacuum, supplying the source gas from the source gas supply unit, forming a film, stopping the supply of the source gas, and unloading the wafer W. This program is stored in a storage medium, e.g., a hard disc, a compact disc, a magneto-optical disc, a memory card or the like, and is installed to the computer therefrom.

Here, the control unit 5 of the present example stores in the storage unit a vaporization flow rate table 51 showing the correspondence between the flow rate set values of the carrier gas and the vaporization flow rates of vaporized Ni (AMD)$_2$. For example, as shown in FIG. 2, the vaporization flow rate table 51 stores the vaporization flow rates corresponding to the carrier gas flow rate set values at 21 measurement points obtained by dividing the flow rate control range (50 sccm to 300 sccm (standard state at 0° C. and 1 atm)) of the MFC 42 into 20 parts.

Further, the source gas supply unit of the present example has a function of creating and updating the vaporization flow rate table 51 in order to deal with the change in the vaporization amount (vaporization flow rate) per unit time of Ni(AMD)$_2$ by the decrease in the amount of the liquid raw material 300 in the case of generating the source gas while maintaining the flow rate of the carrier gas supplied to the raw material tank 3 at a constant level.

In order to create the vaporization flow rate table 51, the control unit 5 switches the destination of the source gas flowing in the source gas supply line 210 to the bypass line 220 and obtains a measured flow rate A of the total flow rate of the source gas (containing the carrier gas and the vaporized raw material) by using the MFM 22. Further, the flow rate of the vaporized raw material contained in the source gas is obtained by calculating a difference between the measured flow rate A and the flow rate set value B of the MFC 42. The vaporization flow rates obtained by sequentially changing the flow rate of the carrier gas are stored in the vaporization flow rate table 51 in a corresponding relationship with the flow rate set values of the carrier gas (FIG. 2).

Further, the control unit 5 can receive a vaporization flow rate set value specified by a user through an external interface 52 such as a touch panel or the like. Moreover, the carrier gas flow rate set value is obtained from the specified vaporization flow rate set value by using the vaporization flow rate table 51, and the flow rate of the MFC 42 is set based on the result. The carrier gas flow rate set value may be obtained by using the carrier gas flow rate set value stored in the vaporization flow rate table 51 when the specified vaporization flow rate values are conincide with any one of the vaporization flow rates of the vaporization flow rate table 51.

Meanwhile, when the specified vaporization flow rate value is a value between two adjacent measurement points of the vaporization flow rate table 51, there may be used a method for specifying a carrier gas flow rate set value by linearly approximating the correspondence relationship between the two measurement points, or the like. For example, when the specified vaporization flow rate set value is 12 sccm, 68.4 sccm of the carrier gas flow rate set value is obtained, by using two adjacent measurement points of 9.75 sccm and 14.5 sccm and the corresponding carrier gas flow rate set values of 62.5 sccm and 75 sccm, from the calculation of 62.5+(75−62.5)*((12−9.75)/(14.5−9.75)).

As described above, the carrier gas flow rate set value is changed in accordance with the state of the liquid raw material 300 in the raw material tank 3. Thus, the control unit 5 also has a function of controlling the supply amount of the dilution gas in accordance with the changes in the flow rate of the carrier gas. In other words, the control unit 5 increases/decreases the flow rate of the dilution gas such that the total flow rate of the carrier gas in the source gas and the dilution gas becomes constant.

Specifically, the difference C−B obtained by deducting the flow rate set value B of the MFC 42 from the total flow rate C of the carrier gas and the dilution gas becomes the flow rate set value (dilution gas flow rate set value) of the MFC 44.

For example, when the total flow rate of the carrier gas and the dilution gas is set to 200 sccm, it is assumed that the carrier gas flow rate set value of 68.4 sccm is calculated based on the vaporization flow rate table 51. At this time, the dilution gas flow rate set value becomes 131.6 sccm (200−68.4=131.6 sccm).

Hereinafter, operations of the source gas supply unit and the film forming apparatus of the present example will be described with reference to FIGS. 3 and 4.

Figure 3:
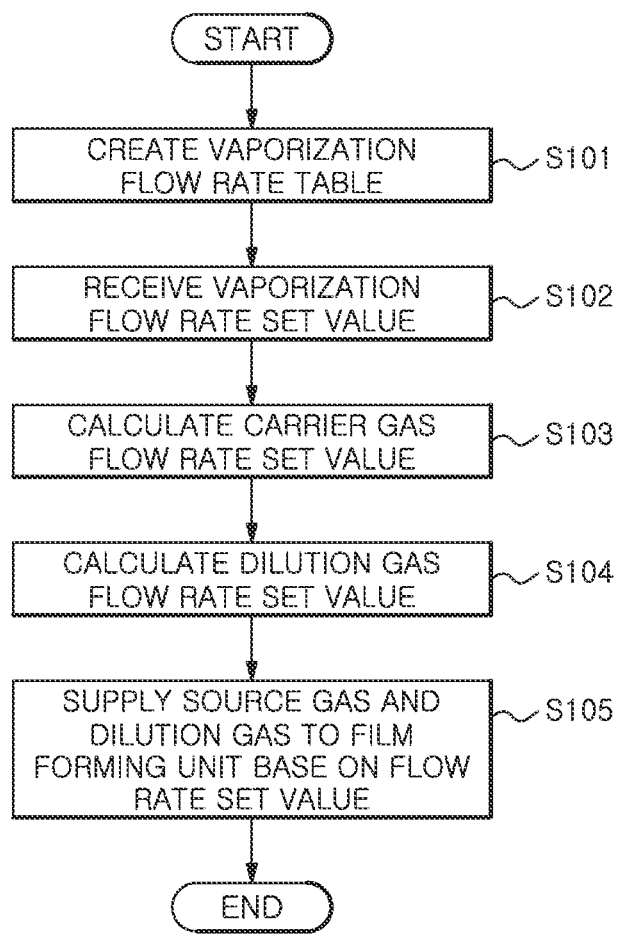
FIG. 3 is a flowchart showing a flow of an operation of the source gas supply unit.

For example, the vaporization flow rate table 51 is created (updated) (step S101 of FIG. 3) before the supply of the source gas is started at the timing of starting the operation of the film forming apparatus that has been stopped (START of FIG. 3).

Figure 4:
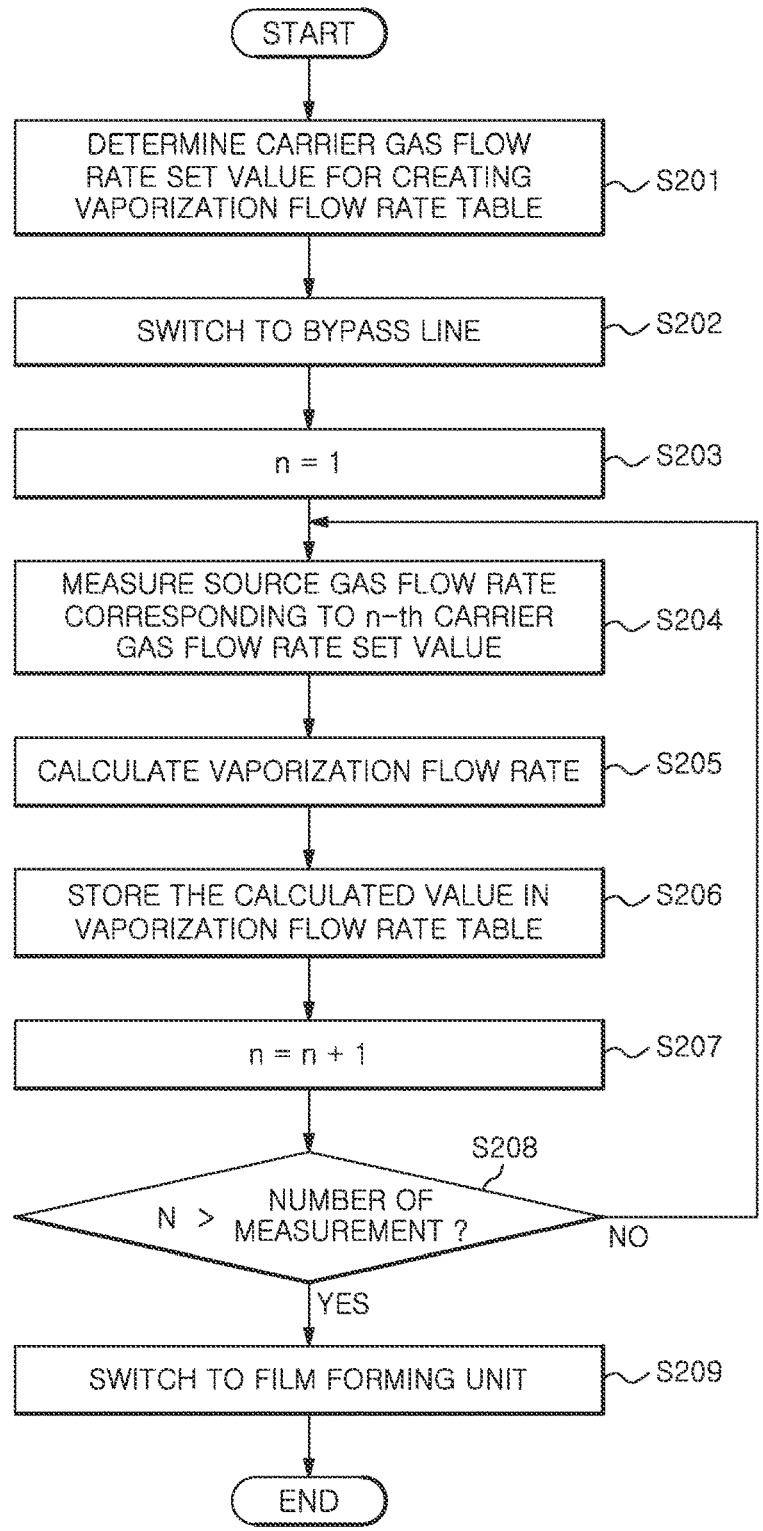
FIG. 4 is a flowchart showing a flow of an operation for creating the vaporization flow rate table.

In order to create the vaporization flow rate table 51, the carrier gas flow rate set value for creating the vaporization flow rate table 51 is determined (step S201) as shown in FIG. 4. In the present example, as shown in FIG. 2, the carrier gas flow rate set values of the measurement points are fixed based on the flow rate control range of the MFC 42 and the contents of the vaporization flow rate table 51. At this time, the number of measurement points or the flow rate control range of the MFC 42 may be set and changed by a user.

Next, the connection destination of the source gas supply line 210 is switched to the bypass line 220 (step S202), and Ni(AMD)$_2$ is fused by supplying the power to the heating unit 31 of the raw material tank 3. Accordingly, the liquid raw material 300 is prepared.

When the temperature in the raw material tank 3 becomes a set temperature and the generation of the source gas is ready, the counter of the number of measurement is reset (the number of measurement n=1) (step S203). Then, the opening/closing valves V2 and V3 are opened, and the carrier gas is supplied to the raw material tank 3 at a flow rate controlled to the first carrier gas flow rate set value (50 sccm in the example of FIG. 2) by the MFC 42.

In that state, after waiting for a predetermined time until the flow rate of the source gas discharged from the raw material tank 3 becomes stable, the source gas flow rate A is measured by the MFM 22 provided at the bypass line 220 (step S204 of FIG. 4). Next, the carrier gas flow rate set value B is deducted from the measured flow rate A of the source gas which has been obtained from the MFM 22, and the vaporization flow rate A−B of the raw material is calculated (step S205).

The calculated vaporization flow rate is stored in the vaporization flow rate table 51 in association with the carrier gas flow rate set value (step S206). Then, the counter is increased (step S207) and compared with a required number of measurements (21 in the present example) (step S208). If the measurement of all the measurement points is not completed (NO in step S208), the operations of the steps S204 to S207 are repeated, and the vaporization flow rate at each measurement point is stored in the vaporization flow rate table 51.

When the measurement is completed (YES in step S208), the supply of the carrier gas to the raw material tank 3 is stopped (the opening/closing valves V2 and V3 are closed), and the connection destination of the source gas supply line 210 is switched to the film forming unit (the processing chamber 11) (step S209), thereby completing the operation for creating the vaporization flow rate table 51 (End).

Here, in view of stability of the flow rate of the source gas or the like, the operations of acquiring the vaporization flow rate at each measurement point (steps S204 to S206) require several minutes. Here, in order to deal with the case in which such a period of time cannot be provided, there is provided an abort function for receiving a command of stopping the operation for creating the vaporization flow rate table 51 from a user through the interface 52. In that case, the previously created vaporization flow rate table 51 is used for calculating the carrier gas flow rate set value.

Further, when calculating a vaporization flow rates at a present number of measurement points among the 21 measurement points, if the calculated flow rates are within a tolerable range (e.g., within a range of ±3%) with respect to the vaporization flow rates corresponding to the carrier gas flow rate set values of the previously created vaporization flow rate table 51, the update of the vaporization flow rate table 51 may be skipped. Even when the previous created vaporization flow rate table 51 is used, the abort function may be utilized by informing to a user that the change in the vaporization flow rate is small.

If the vaporization flow rate table 51 is created by the above-described operations, the specified vaporization flow rate value is received from the user (step S102 of FIG. 3), and a carrier gas flow rate set value is calculated by using the vaporization flow rate table 51 (step S103). Then, a dilution gas flow rate set value is also calculated (step S104).

Meanwhile, in the film forming unit, the wafer W is mounted on the mounting table 12 and heated while exhausting the processing chamber 11 to vacuum. If the film formation is ready, the opening/closing valves V2 and V3 of the raw material tank 3 are opened, and the carrier gas is supplied to the raw material tank 3 at a flow rate controlled based on the carrier gas flow rate set value calculated in the step S103. Then, the source gas is generated and supplied to the film forming unit (step S105). Further, the opening/closing valve V4 of the dilution gas channel 420 is opened, and the dilution gas is mixed with the source gas at a flow rate controlled by the MFC 44 based on the dilution gas flow rate set value calculated in the step S104 (step S105). Based on the operations described above, the creation of the vaporization flow rate table 51 and the setting of the flow rate set values of the carrier gas and the dilution gas are performed, and the supplies of the source gas and the dilution gas are started or stopped in accordance with the progress of the film forming process in the film forming unit (End).

In the film forming unit, a predetermined amount of ammonia gas is supplied to the film forming unit from an ammonia gas supply line (not shown) together with the supply of the source gas ($Ni(AMD)_2$) by the source gas supply unit. As a result, the reduction reaction of $Ni(AMD)_2$ in the processing chamber 11 proceeds, and a Ni film is formed on the surface of the wafer W.

Thereafter, the film formation is performed for a predetermined period of time, and the supplies of the source gas and the ammonia gas are stopped. Then, the wafer W is unloaded from the processing chamber 11, and the loading of a next wafer W is waited.

In accordance with the source gas supply unit of the present embodiment, the following effects are obtained. Before the source gas is supplied to the film forming unit, the vaporization flow rate table 51 showing the correspondence between the vaporization flow rate of the raw material ($Ni(AMD)_2$) contained in the source gas and the flow rate of the carrier gas is created. Further, the flow rate set value of the carrier gas is determined by directly receiving the setting of the vaporization flow rate, i.e., the actual supply amount of the raw material. Therefore, even if the vaporization flow rate to the supply amount of the carrier gas is changed, a desired amount of raw material can be supplied to the film forming unit by a simple method.

For example, the control unit 5 has obtained the vaporization flow rate of the raw material from the difference A-B between the total flow rate A of the source gas and the flow rate set value B of the MFC 42. Therefore, it may be possible to control that the difference A-B and a preset target flow rate of the raw material are compared, and the flow rate set value of the carrier gas is increased or decreased such that the difference A-B becomes equal to the target flow rate. However, when the response time until the vaporization flow rate of the raw material become stable after the flow rate set value of the carrier gas is changed becomes long due to a large size of the raw material tank 3 or the like, the vaporization flow rate cannot be quickly controlled, and hunting may occur. In the present invention, the flow rate of the carrier gas is set based on the previously created vaporization flow rate table 51, and additionally the vaporization flow rate table 51 is updated if necessary. Accordingly, the control can be stably and quickly performed.

Here, the above-described embodiment has described the example in which the vaporization flow rate table 51 is created before the start of the source gas supply such as the operation start of the film forming apparatus or the like. However, the vaporization flow rate table 51 may be created during the operation of the film forming apparatus. For example, after switching the destination of the source gas to the bypass line 220 at a predetermined time interval or whenever a predetermined number of lots are processed or whenever film formation for a predetermined number of wafers W is completed, the flow rate of the source gas (the total flow rate of the vaporization flow rate of the raw material and the carrier gas flow rate) calculated based on the vaporization flow rate table 51 may be compared with the measured flow rate of the actual source gas in the MFM 22. Further, when the difference between the flow rates exceeds a preset threshold value, the request for creation of a new vaporization flow rate table 51 may be informed to the user.

Moreover, in case the effect of pressure loss of the MFM 22 for measuring the flow rate of the source gas is small, the configuration of the film forming apparatus may be simplified by providing the MFM 22 on the source gas supply line 210 without using the bypass line 220. In that case, it is possible to monitor in real time the difference between the vaporization flow rate set value used for the carrier gas flow rate set value calculated based on the aforementioned vaporization flow rate table 51 and the actual source gas flow rate obtained from the flow rate measured by the MFM 22 and the carrier gas flow rate set value. Here, if the difference exceeds a preset threshold value, the vaporization flow rate table 51 may be updated at the timing in which the film formation is not performed in the film forming unit.

Further, the flow rate specified by a user is not limited to a standard state flow rate (e.g., sccm) and may be a mass flow rate (e.g., g/min). In that case, the carrier gas flow rate set value may be specified from the vaporization flow rate table 51 by converting the set value of the mass flow rate received from a user to the vaporization flow rate. Or, the vaporization flow rate table 51 in which the unit of the vaporization flow rate is set to the mass flow rate may be created.

Further, the raw material accommodated in the raw material tank 3 is not limited to the liquid raw material 300, and the source gas may be generated by directly vaporizing (sublimating) a solid material. Moreover, the configuration of the film forming unit is not limited to a single sheet processing type in which one wafer W is mounted on the mounting table 12 and subjected to film formation at a time, and the source gas supply unit of the present invention may be applied to a batch type film forming unit for performing film formation on a plurality of wafers W supported on a wafer boat.

The film formation method of the present invention may be applied to various CVD methods such as a plasma CVD method for performing continuous film formation by activating and reacting the source gas and the reactant gas under the presence of the plasma, an ALD method for reacting the surface of the wafer W onto which the source gas is adsorbed with the reactant gas and depositing the reaction product on the surface of the wafer W, or the like, other than the thermal CVD method described in the example of the film forming unit shown FIG. 1.

In addition, the source gas that can be supplied by using the source gas supply unit of the present invention may be, other than the aforementioned Ni, a source gas containing elements, e.g., Al, Si or the like as elements of the third period of the periodic table, Ti, Cr, Mn, Fe, Co, Cu, Zn, Ge or the like as elements of the fourth period, Zr, Mo, Ru, Rh, Pd, Ag or the like as elements of the fifth period, Ba, Hf, Ta, W, Re, Lr, Pt or the like as elements of the sixth period. Further, the present invention may be applied to the case of providing a plurality of source gas supply units and performing film formation such as alloy formation, complex metal oxide formation or the like by supplying two or more source gases to the film forming unit.

As for the source gas, an organic metal compound, an inorganic metal compound or the like may be used. The reactant gas that reacts with the source gas may be used for various reactions such as oxidation reaction using $O_2$, $O_3$, $H_2O$ or the like, reduction reaction using organic acid such as $NH_3$, $H_2$, HCOOH, $CH_3COOH$ or the like or alcohol such as $CH_3OH$, $C_2H_5OH$ or the like, carbonization reaction using $CH_4$, $C_2H_6$, $C_2H_4$, $C_2H_2$ or the like, and nitriding reaction using $NH_3$, $NH_2NH_2$, $N_2$ or the like.

While the invention has been shown and described with respect to the embodiments, it will be understood by those skilled in the art that various changes and modification may be made without departing from the scope of the invention as defined in the following claims.

What is claimed is:

1. A source gas supply method to a film forming unit for forming a film on a substrate, comprising:
    generating a source gas containing vaporized raw material by supplying a carrier gas to a raw material tank accommodating a solid or liquid raw material at a plurality of carrier gas flow rate set values using a first flow path;
    switching a destination of the source gas to the first flow path so that the source gas bypasses the film forming unit to discharge the source gas;
    measuring flow rates of the source gas at the carrier gas flow rate set values, respectively while the source gas bypasses the film forming unit using the first flow path;
    storing in a storage unit a vaporization flow rate table maintaining correspondence between the carrier gas flow rate set values and vaporization flow rates which are flow rates of the vaporized raw material contained in the source gas and obtained from the difference between the measured flow rates of the source gas and the carrier gas flow rate set values;
    calculating a corresponding carrier gas flow rate set value corresponding to a specified vaporization flow rate set value required by a user for forming the film on the substrate by using the vaporization flow rate table; and
    generating a corresponding source gas by supplying a corresponding carrier gas to the raw material tank at the calculated corresponding carrier gas flow rate set value while supplying the generated corresponding source gas to the film forming unit using a second flow path, wherein the first flow path and the second flow path are different, and wherein the corresponding source gas flows to the film forming unit using the second flow path when forming the film on the substrate.

2. The source gas supply method of claim 1, further comprising:
    calculating a dilution gas flow rate set value by deducting the corresponding carrier gas flow rate set value in the supply of the corresponding source gas to the film forming unit from a preset total flow rate of the corresponding carrier gas and a dilution gas; and
    supplying the dilution gas at the dilution gas flow rate set value to be mixed with the corresponding source gas so that the mixed gas of the dilution gas and the corresponding source gas is supplied to the film forming unit.

3. The source gas supply method of claim 1, wherein the vaporization flow rate table is updated such that the measuring of the flow rates of the source gas and the storing of the vaporization flow rate table are performed before the supplying of the corresponding source gas to the film forming unit.

* * * * *